United States Patent [19]

Mays et al.

[11] Patent Number: 5,709,960
[45] Date of Patent: Jan. 20, 1998

[54] MOLD COMPOUND

[75] Inventors: Lonne L. Mays, Gilbert; Mark D. Mosher, Scottsdale; Alexandra Hubenko, Phoenix, all of Ariz.

[73] Assignee: Motorola, Inc., Schaumburg, Ill.

[21] Appl. No.: 667,563

[22] Filed: Jun. 21, 1996

[51] Int. Cl.$^6$ .................................................. B32B 19/00
[52] U.S. Cl. ........................ 428/698; 257/707; 257/789; 257/795
[58] Field of Search ..................... 428/698; 257/707, 257/789, 795

[56] References Cited

U.S. PATENT DOCUMENTS

| | | | |
|---|---|---|---|
| 3,931,026 | 1/1976 | Berkner | 252/63.2 |
| 4,772,644 | 9/1988 | Itoh et al. | 523/443 |
| 4,985,751 | 1/1991 | Shiobara et al. | 357/72 |
| 5,451,637 | 9/1995 | Leibfried | 525/105 |
| 5,476,716 | 12/1995 | Gallo | 428/413 |

*Primary Examiner*—Melvyn I. Marquis
*Assistant Examiner*—David Aylward
*Attorney, Agent, or Firm*—George C. Chen

[57] ABSTRACT

An electronic component has a body (11) that is formed from a mold compound that includes a thermoplastic material (31), a first filler (32) comprised of an electrically insulative material wherein the first filler (32) is more thermally conductive than the thermoplastic material (31), and a second filler (33) comprised of an electrically conductive material wherein the second filler (33) is more thermally conductive than the thermoplastic material (31).

20 Claims, 2 Drawing Sheets

MOLD COMPOUND

BACKGROUND OF THE INVENTION

This invention relates, in general, to mold compounds, and more particularly, to mold compounds having high thermal conductivity.

In the past, the electronics industry has utilized a variety of electrically insulative mold compounds to package or encapsulate integrated circuits and other semiconductor devices. However, these mold compounds have poor thermal dissipation properties, which limit the power dissipation of the packaged semiconductor devices. Metallic additives or fillers have been added to mold compounds to improve the thermal dissipation properties of the mold compounds. However, such additives often degraded the electrically insulative properties of the mold compounds. Moreover, runners and sprues that guide the mold compound to mold cavities, which contain the semiconductor device, retain a significant volume of the mold compound, and this volume of mold compound is discarded as waste after the molding process.

Accordingly, a need exists for a mold compound that has an efficient thermal conductivity, that is recyclable, and that is electrically insulative.

DETAILED DESCRIPTION OF THE DRAWINGS

Figure 1:
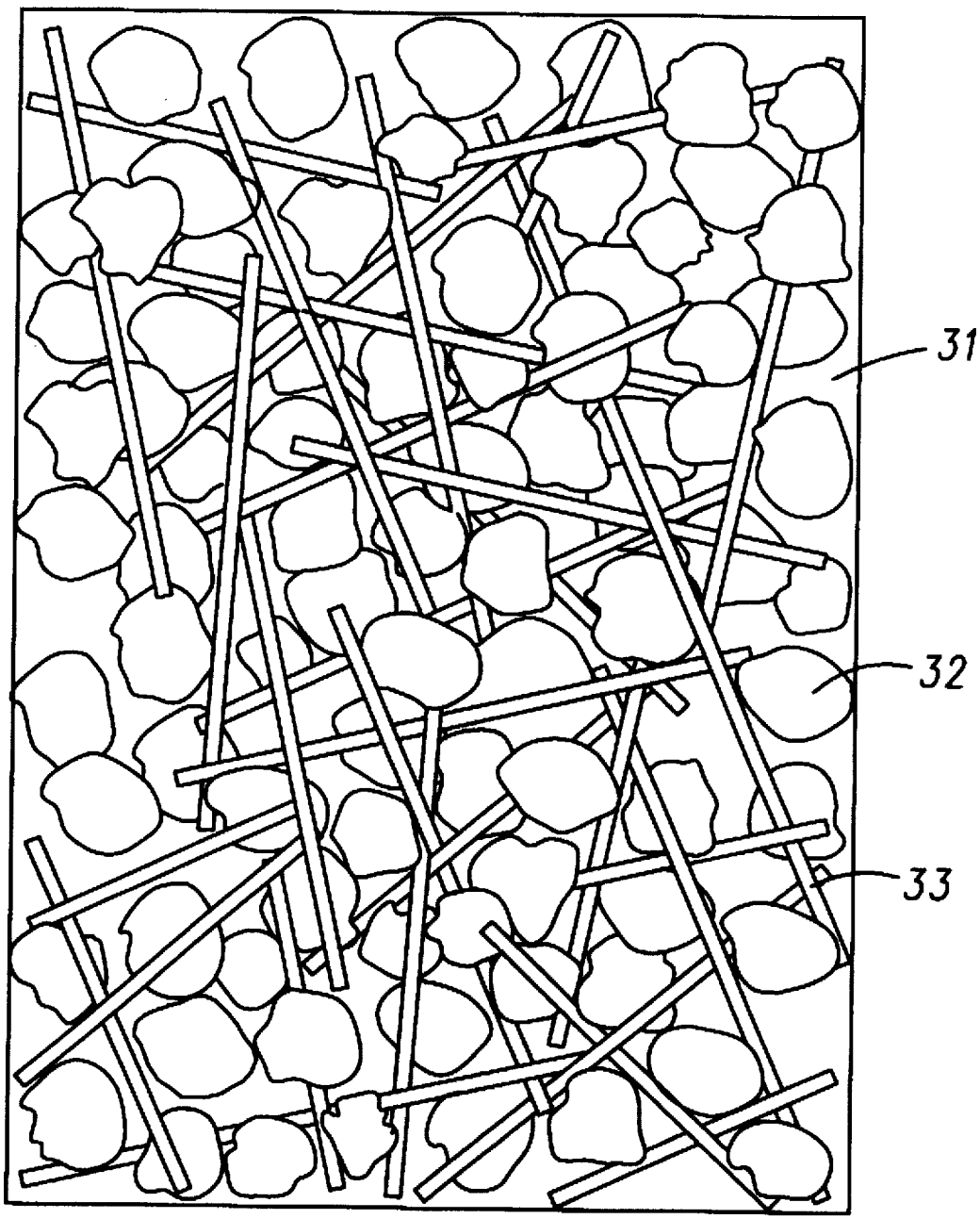
FIG. 1 illustrates a microscopic view of a mold compound in accordance with the present invention.

FIG. 1 illustrates a microscopic view of an encapsulant or mold compound 25, which is comprised of a thermoplastic material 31 and a plurality of fillers 32 and 33. Mold compound 25 is an electrically insulative material and is suitable for packaging semiconductor and other electronic devices. Accordingly, mold compound 25 should be chemically and mechanically stable up to at least a maximum operating or junction temperature of the packaged electronic device. For typical applications, mold compound 25 should be chemically and mechanically stable up to at least approximately two hundred degrees Celsius.

Thermoplastic material 31 is a high temperature plastic or a thermoplastic polymer that is an electrically insulative material. Thermoplastic material 31 can be a material that is conventionally used for high pressure injection molding compounds. An example of a material that is suitable for thermoplastic material 31 includes, but is not limited to, polyphenylene sulfide (PPS), which is commercially sold under the tradenames Ryton™ and Fortron™ by Phillips 66 Company of Bartsville, Okla. and Hoechst Celanese Corporation of Auburn Hills, Mich., respectively. Another example of a material that is suitable for thermoplastic material 31 is polyphthalamide (PPA), which is commercially sold under the tradename Amodel™ by Amoco Performance Products, Incorporated of Atlanta, Ga.

Fillers 32 and 33 are added to thermoplastic material 31 to improve the heat dissipation properties of mold compound 25 because thermoplastic material 31 typically has poor thermal conductivity. Fillers 32 and 33 preferably each have a thermal conductivity that is higher or greater than a thermal conductivity of thermoplastic material 31 in order to maximize the heat transfer efficiency of mold compound 25. Accordingly, mold compound 25 is preferably a homogenous mixture of thermoplastic material 31, filler 32, and filler 33 in order to provide substantially even heat distribution across mold compound 25. Material 31 is preferably not comprised of a thermoset epoxy or other thermoset polymer because the improved heat conduction of mold compound 25 may cause a thermoset polymer to suffer from uncontrolled rapid catalyzation or curing. Therefore, the addition of thermally conductive fillers to a thermoset polymer may degrade the processing characteristics of the thermoset polymer.

Fillers 32 and 33 are comprised of an electrically insulative material and an electrically conductive material, respectively. Filler 33 is typically more thermally conductive than filler 32 because electrically conductive materials are typically more thermally conductive than electrically insulative materials. However, in order to maintain the electrically insulative properties of mold compound 25, a weight percent of electrically conductive filler 33 within mold compound 25 is preferably less than a weight percent of thermoplastic material 31. Similarly, the weight percent of electrically conductive filler 33 is also preferably less than a weight percent of electrically insulative filler 32. Filler 32 is comprised of a thermally conductive and electrically insulative material including, but not limited to, ceramic materials such as aluminum nitride, silicon nitride, silicon carbide, aluminum oxide, or other metal oxides. An example of a commercially available material that is suitable for filler 32 is silica coated aluminum nitride (SCAN™), which is hydrolytically stabilized and which is sold by Dow Chemical of Midland, Mich. SCAN™ fillers typically have a particle, granular, or spherical shape. Filler 33 is comprised of a thermally conductive and electrically conductive material including, but not limited to, carbon and metallic materials. An example of a commercially available material that is suitable for filler 33 is Thermalgraph™, which is comprised of graphite and which is sold by Amoco Performance Products, Incorporated of Atlanta, Ga. Thermalgraph™ fillers typically have an elongated, fiber-like, or filament shape.

The addition of both electrically insulative filler 32 and electrically conductive filler 33 has a synergistic effect that improves the thermal conductivity of mold compound 25 over that of only adding filler 32 or only adding filler 33 to mold compound 25. It is believed that a majority of the heat conduction within mold compound 25 will travel from a first piece of filler 33 to a first piece of filler 32 to a second piece of filler 33 to a second piece of filler 32 and so on because fillers 32 and 33 have higher thermal conductivities than thermoplastic material 31. Filler 33 preferably has an elongated, fiber-like, or filament shape to improve the heat conduction within mold compound 25 and to improve the mechanical stability of mold compound 25. Filler 32 preferably has a particle, granular, or spherical shape to more efficiently separate apart the individual pieces of filler 33 in order to prevent mold compound 25 from becoming an electrically conductive material. Therefore, fillers 32 and 33 preferably have different shapes from each other for the reasons stated hereinbefore. In the preferred embodiment wherein filler 32 is comprised of SCAN™ and wherein filler 33 is comprised of Thermalgraph™, filler 32 has a diameter of approximately forty to eighty microns, and filler 33 has a length of approximately one hundred fifty to two hundred fifty microns and a diameter of approximately ten to thirty microns. The dimensions of filler 33 should be at least approximately one thousand times smaller than any dimension of a molded package that is formed from mold compound 25 in order to maintain the electrical insulative properties of mold compound 25.

The presence of filler 32 assists in breaking up or separating apart the individual pieces of filler 33 and assists in preventing filler 33 from converting electrically insulative mold compound 25 into an electrically conductive material. Therefore, the addition of filler 32 in mold compound 25 increases the amount of filler 33 that can be added to mold compound 25, and by increasing the amount of filler 33 in mold compound 25, the thermal conductivity of mold compound 25 is increased even further because filler 33 has a higher thermal conductivity than either filler 33 or thermoplastic material 31. In the preferred embodiment, the weight percent of filler 32 is greater than the weight percent of thermoplastic material 31 in order to optimize the thermal conductivity and the electrically insulative properties of mold compound 25. More specifically, filler 33, filler 32, and thermoplastic material 31 preferably have weight percents of less than approximately ten percent, approximately fifty to sixty percent, and less than approximately fifty percent, respectively. In the preferred embodiment, the weight percent of filler 32 preferably does not exceed approximately sixty percent because of the degradation of the mechanical properties of mold compound 25 when the concentration of filler 32 exceeds approximately sixty weight percent. Furthermore, the moldability of mold compound 25 is also reduced or detrimentally affected at the higher concentrations of filler 32.

Mold compound 25 is compatible with conventional high pressure injection molding techniques. During the molding process, fillers 32 and 33 can remain solid while thermoplastic material 31 is liquefied. After the molding process, unused or excess portions of mold compound 25 are recyclable and are not wasted as in the prior art where thermoset polymers are used. Mold compound 25 can be remelted and reused because thermoplastic material 31 is comprised of a thermoplastic polymer that is not significantly chemically altered during the molding process. In addition, the cycle time for molding mold compound 25 is shorter than the cycle time for the prior art because the improved thermal conductivity of mold compound 25 enables faster liquefaction and solidification of mold compound 25. Furthermore, when a thermoplastic polymer is used in mold compound 25, the cycle time required for molding mold compound 25 is shorter than the cycle time associated with using a thermoset polymer because thermoset polymers require a curing step after the molding step while thermoplastic polymers do not require a curing step after the molding step.

Figure 2:
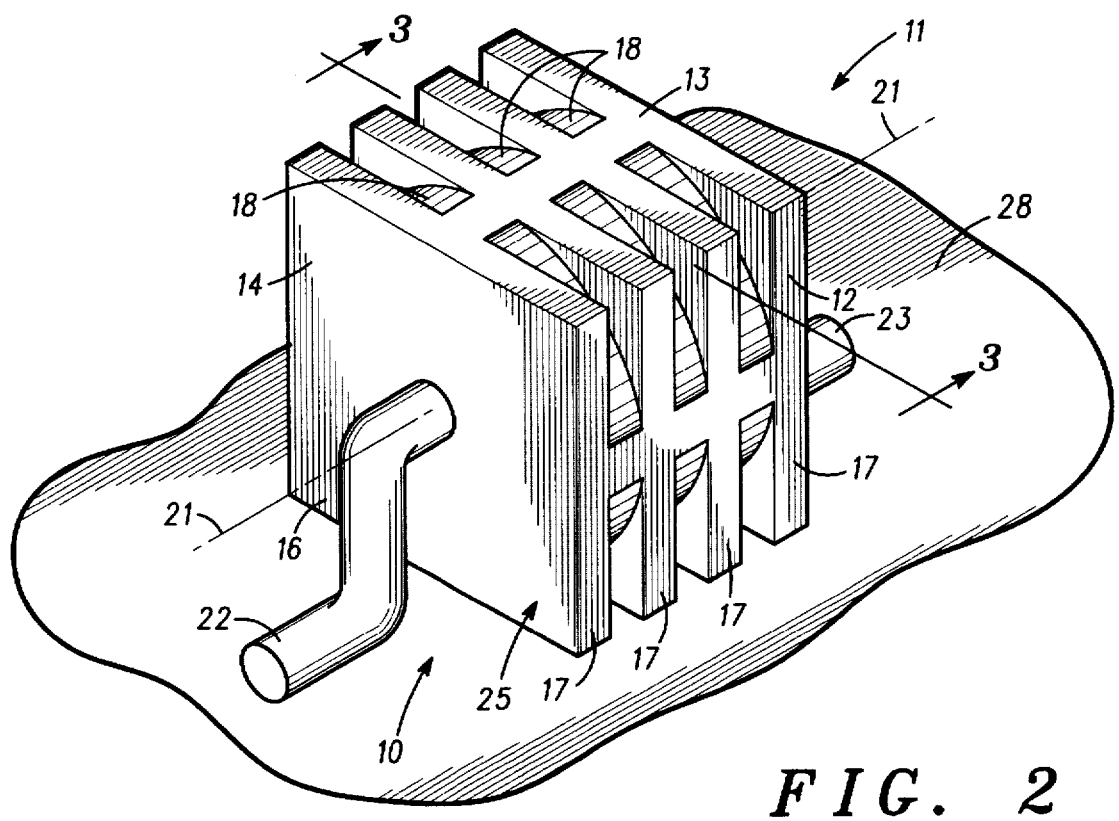
FIG. 2 portrays an isometric view of an electronic component in accordance with the present invention.
Figure 3:
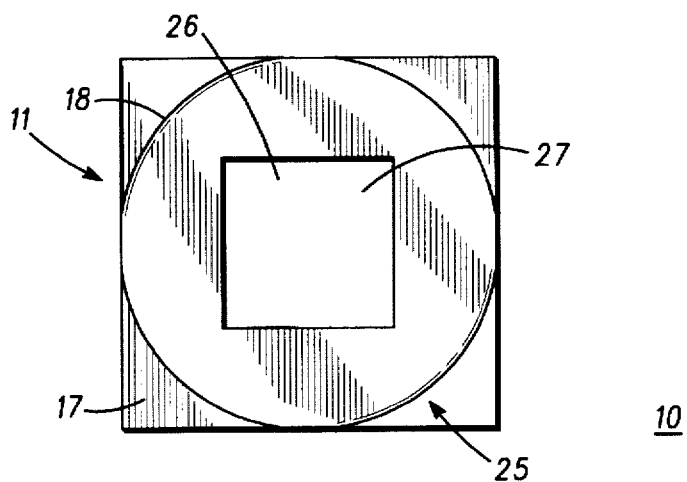
FIG. 3 depicts a cross-sectional view of the electronic component taken along a section line 3—3 of FIG. 2.

FIG. 2 portrays an isometric view of an electronic component 10, and FIG. 3 depicts a cross-sectional view of component 10 taken along a section line 3—3 of FIG. 2. It is understood that the same reference numerals are used in the figures to denote the same elements. Component 10 includes an integrated circuit or other semiconductor device 27 (FIG. 3) in a semiconductor substrate 26 (FIG. 3). Substrate 26 can be comprised of a semiconductor material including, but not limited to, silicon or gallium arsenide. Device 27 can be formed in substrate 26 using semiconductor processing techniques known to those skilled in the art.

Component 10 additionally includes a body 11 that is comprised of mold compound 25. Body 11 is electrically insulative and is suitable for housing, packaging, or encapsulating electronic components such as semiconductor devices, integrated circuits, resistors, and other electronic devices. As illustrated in FIGS. 2 and 3, body 11 is molded to overlie, cover, or surround at least a portion of substrate 26. Body 11 can assist in the formation of a surface mount device, can facilitate mounting component 10 to a printed wiring board, and can facilitate high power and heat dissipation for component 10. Mold compound 25 of body 11 is molded to form a plurality of ribs or fins 17 that extend substantially perpendicularly to a major axis 21 of both body 11 and component 10. Fins 17 can be molded into a heat sink adjacent to substrate 26 as shown in FIG. 2, or fins 17 can alternatively be molded around a separate metal heat sink (not shown) to which substrate 26 can be attached. Fins 17 typically have a polygon, circular, or other shape, which can have axial or non-axial symmetry about axis 21. Each of fins 17 has a side that forms both the outermost surface of body 11 and a side of the circular, polygon, or other shape. For the polygon shown in FIG. 2, fins 17 have surfaces or sides 12, 13, 14, and 16 that form the outermost surfaces of body 11 and that form each side of the polygon shape. Thus, each side of the polygon shape forms a flat surface that is in a plane substantially parallel to axis 21 wherein each side of the polygon shape forms one outermost surface of body 11.

Fins 17 are separated by interposed spaces 18 that are portions of body 11 recessed closer to axis 21 than are outermost surfaces of body 11 or sides 12, 13, 14, and 16. Typically, the portion of body 11 in spaces 18 has a different shape than the outermost surfaces of body 11. As shown in FIG. 2, the portion of body 11 in spaces 18 has a cylindrical shape having a diameter substantially equal to the width of fins 17. However, the portion of body 11 within spaces 18 can have other shapes and other dimensions, such as, the same polygon shape as fins 17 but having a smaller dimension than fins 17. The diameter of body 11 in spaces 18 should be sufficient to cover and protect internal elements such as, for example, substrate 26. The width of spaces 18, or the distance between fins 17, should be sufficient to allow for convection cooling of fins 17.

Component 10 has a large surface area that increases the thermal dissipation of component 10 because of fins 17 that are molded from mold compound 25. Component 10 can have a surface area that is at least approximately twenty percent larger than prior art packages. It is believed that component 10 provides at least twenty percent higher convection cooling power dissipation than prior art packages. Additionally, the flat surface of each side of the polygon shape of component 10 forms a surface-mount device and allows component 10 to rest flat on an underlying assembly substrate 28. Therefore, the flat surface provides increased conduction cooling from component 10 to substrate 28 and thereby further increases the thermal dissipation of component 10.

Typically, mold compound 25 is used to mold body 11 to surround device 27, substrate 26, and portions of leads 22 and 23 using molding techniques described hereinbefore. Leads 22 and 23 of component 10 are electrically coupled to device 27, and leads 22 and 23 exit at opposite end surfaces of body 11 along axis 21. Although component 10 is depicted as having only two leads, it is understood that component 10 can have any number of appropriate leads. In an alternative embodiment, leads 22 and 23 are a plurality of flip chip bumps or the like.

Therefore, it is apparent there has been provided an improved mold compound that overcomes the disadvantages of the prior art. The mold compound described herein has a high thermal conductivity while maintaining its electrically insulative properties. Furthermore, the present mold compound is cost effective because the mold compound is reusable or recyclable. Additionally, the cycle time for molding a component using the mold compound described herein is reduced over the prior art.

While the invention has been particularly shown and described with reference to preferred embodiments, it will be understood by those skilled in the art that changes in form and detail may be made without departing from the spirit and scope of the invention. For instance, the numerous details set forth herein, such as, for example, the specific chemical compositions of mold compound 25 and the specific dimensions of fillers 32 and 33, are provided to facilitate the understanding of the present invention and are not provided to limit the scope of the invention. Furthermore, it is understood that mold compound 25 does not have to be molded into a heat sink having a plurality of fins. Instead, mold compound 25 can be used to mold more conventionally shaped semiconductor packages that do not have a plurality of fins. For example, mold compound 25 can be used to package overmolded devices such as ball grid arrays. Accordingly, the disclosure of the present invention is not intended to be limiting. Instead, the disclosure of the present invention is intended to be illustrative of the scope of the invention, which is set forth in the following claims.

We claim:

1. An electronic component comprising:
   a semiconductor substrate;
   a semiconductor device in the semiconductor substrate;
   a lead electrically coupled to the semiconductor device; and
   an encapsulant overlying the semiconductor device wherein the encapsulant is electrically insulative, the encapsulant comprising:
      a plurality of electrically conductive fibers having a first thermal conductivity;
      a plurality of electrically insulative particles having a second thermal conductivity; and
      a thermoplastic polymer having a third thermal conductivity, the third thermal conductivity less than the first and second thermal conductivities.

2. The electronic component of claim 1 wherein a weight percent of the thermoplastic polymer and a weight percent of the plurality of electrically insulative particles are each greater than a weight percent of the plurality of electrically conductive fibers.

3. The electronic component of claim 2 wherein the weight percent of the plurality of electrically conductive fibers is less than approximately ten percent.

4. The electronic component of claim 1 wherein the encapsulant is further comprised of a homogenous mixture of the thermoplastic polymer, the plurality of electrically insulative particles, and the plurality of electrically conductive fibers.

5. The electronic component of claim 1 wherein the encapsulant surrounds the semiconductor substrate, the semiconductor device, and a portion of the lead.

6. The electronic component of claim 1 wherein the encapsulant forms a heat sink having a plurality of fins.

7. An electronic component comprising:
   a semiconductor device; and
   a mold compound covering the semiconductor device, the mold compound comprising:
      a thermoplastic material;
      a first filler comprised of an electrically insulative material wherein the first filler is more thermally conductive than the thermoplastic material; and
      a second filler comprised of an electrically conductive material wherein the second filler is more thermally conductive than the thermoplastic material.

8. The electronic component of claim 7 wherein the mold compound is electrically insulative and wherein the mold compound is a homogenous mixture of the thermoplastic material, the first filler, and the second filler.

9. The electronic component of claim 7 wherein the first filler is comprised of a material selected from the group consisting of silicon, aluminum nitride, or a metal oxide.

10. The electronic component of claim 7 wherein the first filler has a granular shape.

11. The electronic component of claim 4 wherein a weight percent of the first filler is greater than a weight percent of the second filler.

12. The electronic component of claim 7 wherein the second filler is more thermally conductive than the first filler.

13. The electronic component of claim 7 wherein the second filler is comprised of carbon.

14. The electronic component of claim 7 wherein the second filler is comprised of graphite.

15. The electronic component of claim 7 wherein the second filler has a filament shape.

16. An electronic component comprising:
   a semiconductor device; and
   an electrically insulative mold compound overlying at least a portion of the semiconductor device, the electrically insulative mold compound having a plurality of fillers wherein a first one of the plurality of fillers is electrically insulative and wherein a second one of the plurality of fillers is electrically conductive and wherein a weight percent of the first one of the plurality of fillers is greater than a weight percent of the second one of the plurality of fillers.

17. The electronic component of claim 16 wherein the electrically insulative mold compound further comprises an electrically insulative thermoplastic material wherein a weight percent of the electrically insulative thermoplastic material is less than the weight percent of the first one of the plurality of fillers and wherein the weight percent of the electrically insulative thermoplastic material is greater than the weight percent of the second one of the plurality of fillers.

18. The electronic component of claim 17 wherein the second one of the plurality of fillers is more thermally conductive than the electrically insulative thermoplastic material and first one of the plurality of fillers and wherein the first one of the plurality of fillers is more thermally conductive than the electrically insulative thermoplastic material.

19. The electronic component of claim 16 wherein the first one of the plurality of fillers and the second one of the plurality of fillers have different shapes.

20. The electronic component of claim 16 wherein the electrically insulative mold compound is molded into a plurality of fins.

* * * * *